United States Patent [19]

Schreiner et al.

[11] 3,954,459
[45] May 4, 1976

[54] METHOD FOR MAKING SINTERED SILVER-METAL OXIDE ELECTRIC CONTACT MATERIAL

[75] Inventors: Horst Schreiner; Bernhard Rothkegel, both of Nurnberg, Germany

[73] Assignee: Siemens Aktiengesellschaft, Munich, Germany

[22] Filed: Nov. 27, 1973

[21] Appl. No.: 419,234

[30] Foreign Application Priority Data

Dec. 11, 1972 Germany............................ 2260559

[52] U.S. Cl................................ 75/206; 75/213;
252/514; 252/518
[51] Int. Cl.$^2$............................................ B22F 1/00
[58] Field of Search .............. 75/206, 213; 252/514, 252/518

[56] References Cited
UNITED STATES PATENTS

| | | | |
|---|---|---|---|
| 2,671,953 | 3/1954 | Balke | 75/213 |
| 3,158,473 | 11/1964 | Gatti | 75/213 |
| 3,317,991 | 5/1967 | Haarbye | 75/213 |
| 3,504,058 | 3/1970 | Masselol | 264/.5 |
| 3,506,437 | 4/1970 | Gwyn, Jr. | 75/206 |
| 3,832,156 | 8/1974 | Wilson et al. | 75/213 |

*Primary Examiner*—Benjamin R. Padgett
*Assistant Examiner*—B. Hunt
*Attorney, Agent, or Firm*—Kenyon & Kenyon Reilly Carr & Chapin

[57] ABSTRACT

To make an electric contact material, a molten alloy of silver and a non-noble metal is atomized into spheroidal particles having a particle size ranging up to almost 1 mm, and the fraction of these particles having a particle size ranging between 0.2 and 1 mm is separated, a small remainder of smaller particle size being treated as a reflux. This fraction is heated in an oxidizing atmosphere to oxidize the non-noble metal internally within the particles and the latter are then mechanically broken, as by suitable milling or pulverizing, into fragments having a particle size no greater than about 0.3 mm. The fragmented particles are then compressed, as by pressure molding, extrusion, etc., and sintered to provide a sintered silver-metal oxide electric contact material.

3 Claims, 7 Drawing Figures

METHOD FOR MAKING SINTERED SILVER-METAL OXIDE ELECTRIC CONTACT MATERIAL

BACKGROUND OF THE INVENTION

This invention relates to the field of sintered electric contact materials particularly suitable for making contacts which must make and break while carrying relatively high power currents.

German Pat. No. 1,029,571 suggests a method for manufacturing sintered electric contact material by atomizing into an oxidizing atmosphere a molten alloy of silver and a non-noble metal, the non-noble metal being one that oxidizes at a temperature less than would result in the silver being oxidized. The result is a powder of spheroidal particles with the non-noble metal internally oxidized within the particles. Powder metallurgical techniques can be used to form the electric contact material from this powder. Metals, such as zinc, cadmium, mercury, tin and/or lead may be used as the non-noble metal alloyed with the silver to comprise the molten alloy that is atomized to form the spheroidal particles.

German Offenlegungsschrift No. 2,011,002 sugggests a silver-metal oxide contact material having a coarse grained silver matrix with the metal oxide in the form of particles having a size less than 0.1 microns, concentrated at the grain boundaries of the silver.

This second suggestion has the disadvantage that the concentration of the metal oxide particles at the silver grain boundaries causes the resulting material to be excessively brittle.

The first suggestion has the disadvantage that the internally oxidized particles obtained by atomization, are spheroidal in shape preventing them from being compressed into moldings of adequately low porosity, the sintered moldings being of high porosity whereas electric contact material should be substantially free from porosity. The oxidized internal non-noble metal component provides such spheroidal particles with a dispersion-hardening effect preventing their deformation by compression to effect closing of the voids resulting from their spheroidal shape.

Furthermore, known techniques for atomizing a silver-non-noble metal alloy to powder form having a particle size below 0.2 mm, results in a yield of such maximum size of only about 50 percent, the balance of the particles necessarily being treated as a reflux which must be returned for remelting to be again atomized. This particle size cannot be exceeded to any substantial degree if the powder is to have good molding properties.

The object of the present invention is to provide a method for making electric contact material consisting of sintered internally oxidized silver-metal oxide powder particles, which avoids the foregoing undesirable features.

SUMMARY OF THE INVENTION

According to this invention, the molten silver-metal oxide alloy is pressure-atomized to form the spheroidal particles with a particle size ranging upwardly to almost as large as 1.0 mm. By sieving or otherwise, the fraction of these spheroidal particles having a particle size ranging from about 0.2 to about 1 mm is separated, the particles of smaller particle size being treated as reflux and returned to the molten alloy to be again pressure-atomized. This fraction, when using known pressure-atomizing techniques, represents a particle yield of more than 90 percent, a great advantage as compared to the 50 percent yield previously referred to.

This separated fraction is then heated in an oxidizing atmosphere at temperatures oxidizing the non-noble component of the alloy. This component is oxidized inside of the particles. The relatively larger particle size of the separated fraction are supposed to be a disadvantage because higher oxidizing temperatures must be required than are needed for particles having a size less than 0.2 mm, a natural conclusion being that the particles at such higher temperatures would sinter together. Surprisingly, it has been found that the particles ranging from 0.2 up to almost or just under 1 mm do not sinter or otherwise stick together even at the necessarily high oxidizing temperatures, as exemplified by 800°C.

Next, the now internally oxidized particles are broken into fragments. This may be done by known milling or pulverizing techniques. As previously indicated, these particles are dispersion hardened, making their milling or pulverizing difficult and, therefore, impractical unless a substantial advantage is obtained. Surprisingly, such an advantage has been found to exist; namely, that the fragments resulting from breaking the internally oxidized particles provides a powder of substantially improved molding characteristics. Also, a more uniform powder quality with a narrowed tolerance spread of distribution is obtained.

The milling or pulverizing known techniques are adequate to produce fragments having a particle size of 0.3 mm or less, but preferably the particle size is reduced to not more than 0.2 mm.

This improvement in moldability permits the powder of now fragmented internally oxidized silver-metal oxide spheroidal particles initially or larger size, to be molded into shapes of relatively low porosity and having firm edges, without requiring excessively high molding pressures. Firm shapes, suitable for subsequent sintering, can be made by using molding compression pressures of 1 ton/cm$^2$, whereas spheroidal powder particles of the same composition, exemplified by AgCdO, require a pressure of 1.8 to 2.0 ton/cm$^2$ and even so high porosity results.

In addition to moldability, the fragmented powder fraction has better flow properties and pouring and tapping density. Moldings of closer tolerances can be obtained, permitting more accurately dimensioned contacts.

The above mentioned greater uniformity has one very important effect. Using AgCdO powder as an example, the sintered molded structure, when in service as an electric contact, has an effectively lower burn-off rate during arcing. Using a well-known comparison method for measuring burn-off, a burn-off rate $a = 157 \times 10^{-6}$ cm$^3$/As was determined for the contacts of fragmented powder, while the burn-off rate for contacts of unfragmented powder was $186 \times 10^{-6}$ cm$^3$/As.

DETAILED DESCRIPTION OF THE INVENTION

Figure 1:
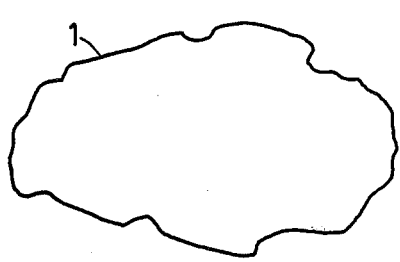
FIG. 1 shows the spheroidal shape of one of the pressure-atomized powder particles.

In more detail, the new method of this invention starts out with a silver alloy powder which contains at least one non-noble metal and has a particle size of less than 1 mm. This powder is converted into a composite silver-metal oxide powder by internal oxidation, whereupon this powder is comminuted by milling to a particle size of less than 0.3 mm. The silver alloy powder can be prepared by atomizing the melt. The atomizing conditions can be adjusted, for instance, so that a yield of more than 90 percent is achieved for the particle size ranging under 1 mm. Thereby, a smaller reflux component is obtained, which must be returned for remelting. The internal oxidation of the silver-metal alloy powder is accomplished in an oxygen-containing atmosphere, e.g., in air, in pure oxygen, or at increased oxygen pressure, at temperatures of between 600° and 800°C, in a relatively short time to complete internal oxidation of the powder particles. This oxidizing process can be carried out in an inclined heatable bell or, also, continuously in a rotary tubular furnace. The internally oxidized powder is subsequently comminuted by milling, whereby the spheroidal powder particles are fragmented and acquire a particle shape which is more favorable for the compressibility in molding. After milling, the powder is screened and the particle size range below 0.3 mm is used.

This composite powder is shaped by pressing into a molding with firm edges, forming slabs or studs. After sintering, the sintered bodies are cold or hot-formed. If the sintered body is subsequently coined in cold condition, a fill factor of better than 98 percent is usually achieved. As the burn-off rate in the arc of electric contacts decreases with decreasing residual porosity, the coined sintered contact is sintered a second time for improving the quality, and is coined a second time. In this condition a fill factor of practically 100 percent, i.e., substantially complete freedom from pores, is achieved.

If the sintered body is repressed in hot condition, it is heated to a temperature of between 600° and 800°C and compressed in a hot repressing die. The pressure for hot repressing is, as it is for cold-compressing, about 8 ton/cm². The shape of the sintered body must be fitted to the final shape of the contact, so that in hot repressing, uniform closing takes place everywhere and a contact practically free of pores is produced. Hot-forming of the sintered body can also be carried out in extrusion presses, wherein the sintered body preheated to 600°–800°C is processed into a ribbon, for instance, with the profile of the contact.

As the non-noble metal alloyed with the silver base metal at least one of the metals cadmium, zinc, tin, iron, nickel, copper or lead may be used.

For cadmium the concentration of metal oxide is advantageously between 5 and 20 percent by weight, and in the case of the other metals, between 3 and 15 percent by weight. For sintered composite materials which contain two different metal oxides in the silver base metal, the different oxides particularly suitable are $CdO$ $ZnO$, $CdO$ $SnO_2$, $CdO$ $Fe_3O_4$, $CdO$ $CuO$, $CdO$ $NiO$, $CdO$ $PbO$, $ZnO$ $SnO_2$, $ZnO$ $Fe_3O_4$, $ZnO$ $CuO$, $ZnO$ $NiO$, $ZnO$ $PbO$, $SnO_2$ $Fe_3O_4$, $CuO$ $SnO_2$ $NiO$ $SnO_2$, $PbO$ $SnO_2$ $CuO$ $Fe_3O_4$, $NiO$ $Fe_3O_4$, $PbO$ $Fe_3O_4$, $CuO$ $PbO$ and $CuO$ $NiO$. The concentration of the sum of two different metal oxides in silver, is advantageously made between 3 and 20 percent by weight. In special cases the solubility of the metal additions in the liquid silver limits their concentration. For reasons of the properties of the Ag-MeO-MeO materials, such as, for instance, the brittleness, the concentration of the second metal oxide may be between 0.05 and 1 percent.

Because of the poor wettability of the AgMeO contact materials by liquid solder, or the unfavorable welding properties of these materials, two-layer contacts with a layer of highly solderable or weldable metal may be manufactured, in order to achieve a reliable bonding technique. Single-layer contacts with good soldering properties can be obtained by dissolving the metal oxide components on the soldering side, for instance, with acid. This is possible with molded parts as well as with extrusion-molded strips of semi-finished material.

The invention is explained below in further detail, making reference to the above drawings and giving examples of embodiments.

FIG. 1 shows schematically on a greatly enlarged scale the shape of a generally spheroidal powder particle 1 of an AgCd 10.3 alloy of the particle-size fraction previously referred to. It is not larger than a 1.0 mm size.

After internal oxidation to AgCd 0 11.7 (FIG. 2), the same powder particle 1 internally contains fine and uniform CdO precipitate 2 as well as isolated CdO concentrations 3 adjacent to the grain boundaries.

Figure 2:
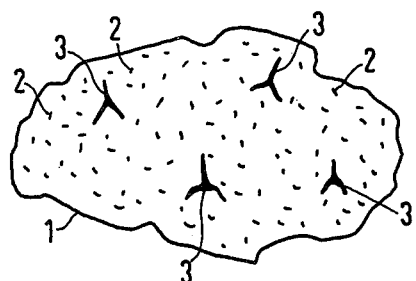
FIG. 2 shows the internal structure after internal oxidation.
Figure 3:
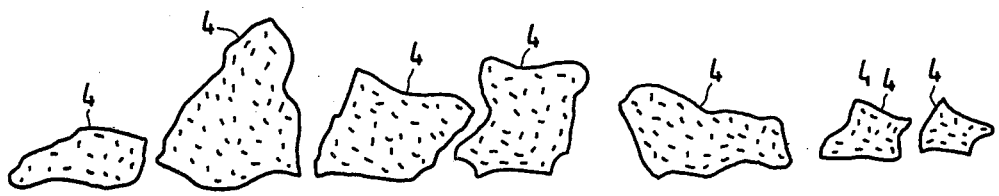
FIG. 3 shows fragments of the particle shown in FIG. 2.

FIG. 3 shows schematically fragments 4 of the broken or milled or pulverized powder particle 1 shown in FIG. 2. The fracture surfaces run mainly along the CdO precipitates concentrated adjacent to the grain boundaries. This produces greater uniformity with respect to the CdO distribution in the structure of the fragments.

Figure 4:
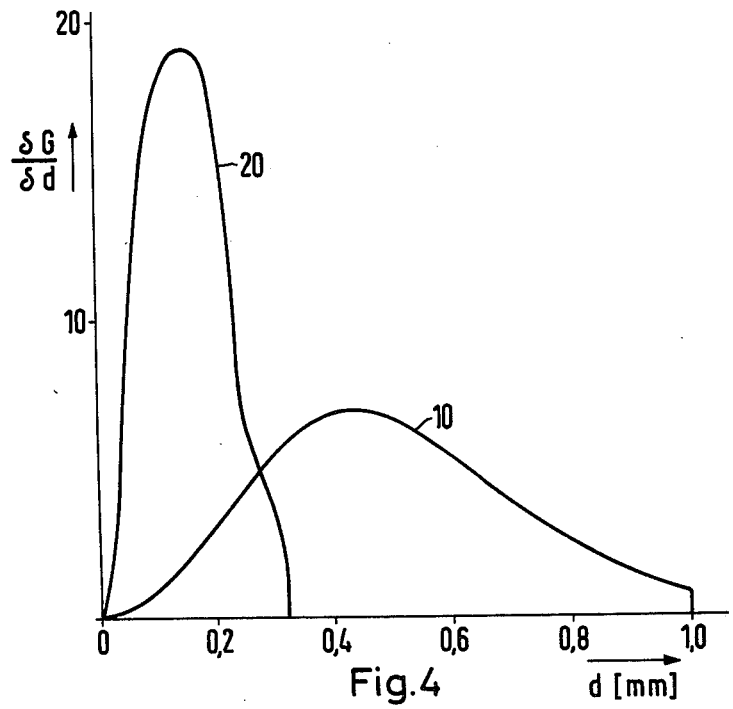
FIG. 4 graphically shows the particle distribution of the internally oxidized, atomized powder.

FIG. 4 shows graphically the particle size distribution of the internally oxidized, atomized powder, for instance, of AgCdO before milling, and the shift in the frequency distribution that occurred as a result of the milling. The particle size d in mm is plotted along the abscissa and the particle size distribution $\delta G/\delta d$ is plotted along the ordinate. Curve 10 shows the particle size distribution before milling and Curve 20, the particle size distribution after milling.

EXAMPLE 1

AgCdO Contact

For the preparation of the AgCdO composite powder, an AgCd alloy with a Cd content of 10.3 percent by weight was made and the melt was transformed by pressure-atomizing into an AgCd alloy powder. The metal powder, collected in water, was dried and the particle-size fraction of less than 1 mm was screened out. This AgCd 10.3 alloy powder fraction was internally oxidized in air for 2 hours at 800°C. The completeness of the internal oxidation was checked by the increase in weight and by means of a metallographic polished section. If the internal oxidation is not complete, the now internally oxidized AgCd alloy can be distinguished clearly from the internally oxidized AgCd region in the polished micro section of the powder particles.

In another case the internal oxidation was carried out at the above temperature in oxygen at 1 atm, and in still another case, in oxygen at 3 atm gauge. By these measures, the oxidation time can be shortened.

The AgCd composite powder had a CdO content of 11.7 percent by weight. The particle-size fraction under 1 mm obtained by screening was comminuted in a mill suited for this process. A blower pulverizer, in which the powder to be comminuted was sucked in through a rotor and passed through a screen, has been found to be advantageous for this purpose. The particle-size fraction under 0.315 mm (standard screen) was screened out from the milled powder. The components about 0.315 mm were milled further, until they passed through the mentioned screen completely.

Figure 5:
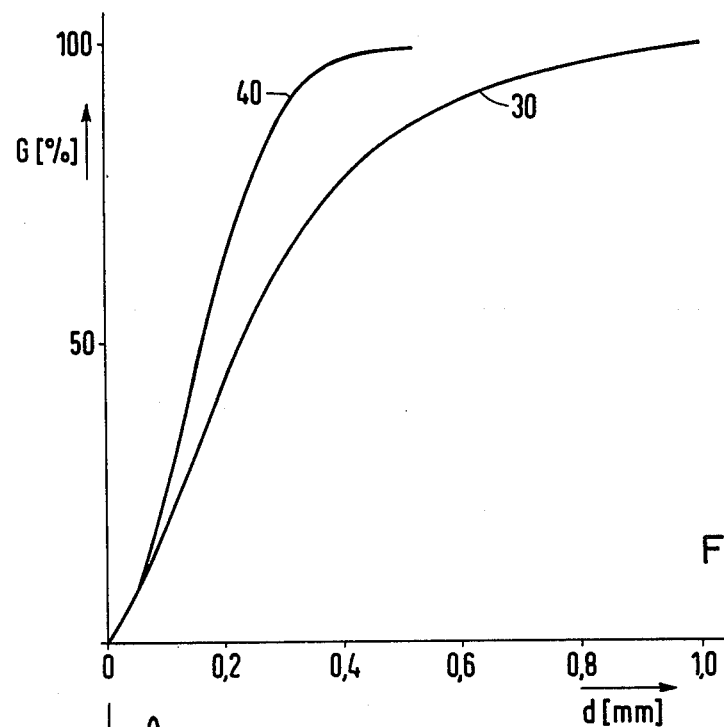
FIG. 5 graphically shows the passage characteristics of the powders before and after milling.

FIG. 5 shows the passage characteristic of the powders before and after milling. The particle size $d$ in mm is plotted along the abscissa and the powder component G in percent by weight along the ordinate. Curve 30 shows the passage characteristic before milling, and Curve 40 shows the passage characteristic after milling.

Figure 6:
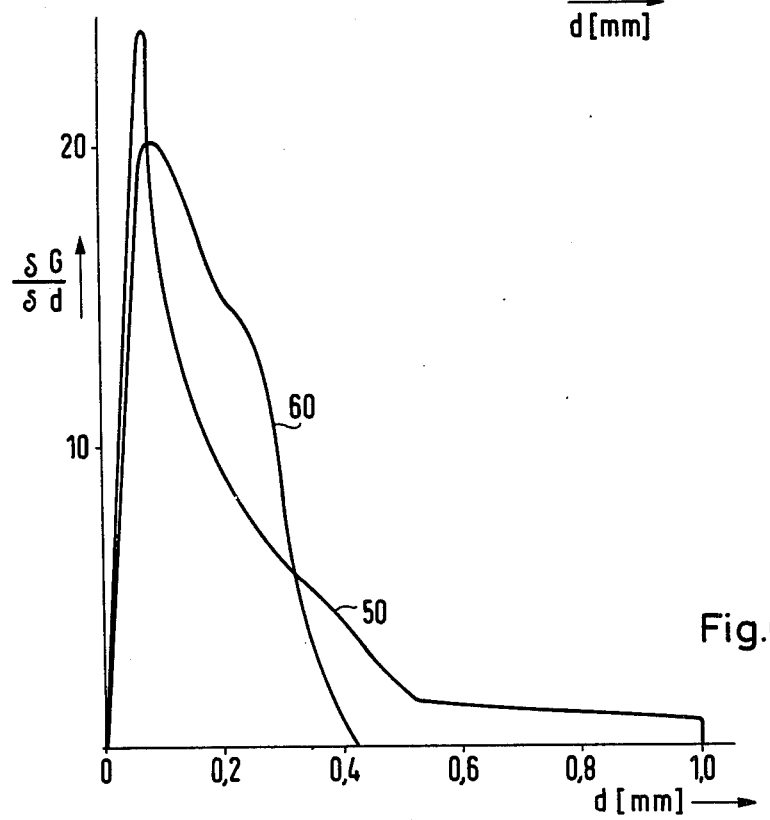
FIG. 6 graphically shows particle size distribution.

The derivative $\delta G/\delta d$ yields the particle-size distribution curves 50 (before milling) and 60 (after milling) shown graphically in FIG. 6. The AgCdO powder was mixed with an addition of 0.2 percent by weight of zinc stearate or stearic acid as a molding aid, which was uniformly rubbed into the powder surfaces. The powder, ready for molding was pressed into a contact molding at 4.5 tons/cm². The sintering was carried out in air at 800°C for 1 hour.

Figure 7:
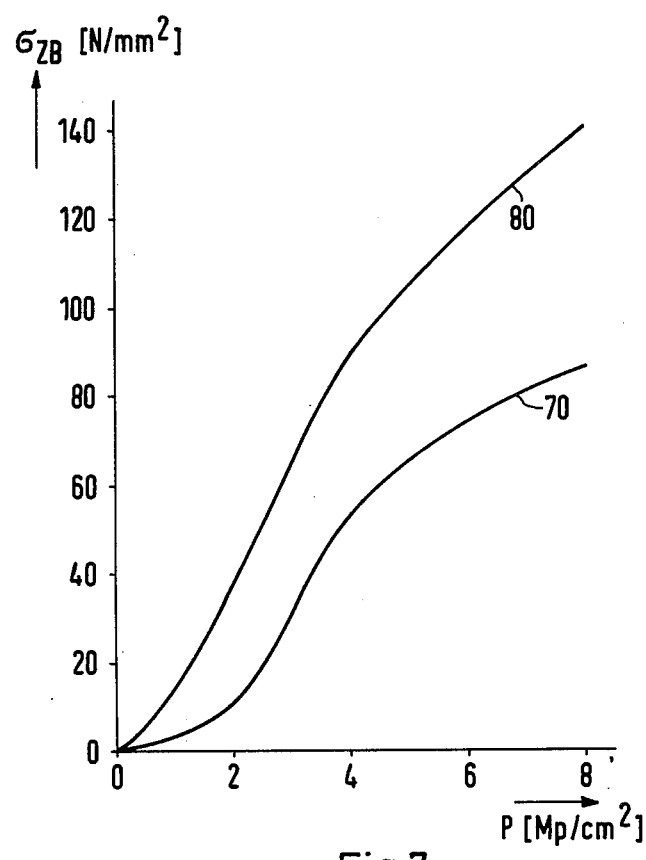
FIG. 7 graphically shows the tensile strengths of the sintered materials.

In FIG. 7, the tensile strength $\delta_{ZB}$ (in N/mm²) of the sintered AgCdO 11.7 materials is given as a function of the molding pressure P (in 1000 kg/cm²). Curve 70 shows the tensile strength before milling, and Curve 80, the tensile strength after milling. The effect of the milling is seen from a comparison between the curves 70 and 80.

The sintered parts were repressed cold or hot after cooling. Cold repressing was performed with a pressure of 8 tons/cm². The hot repressing was carried out, after preheating the contacts to 800°C and placing them quickly in the pressing tool, at a pressure of 8 tons/cm² at about 650°C, holding the pressure for 1 second. To obtain a practically pore-free contact, a deformation factor of 25 percent was maintained. The repressed contacts were deburred in a barrel and bonded to contact carriers to form switch elements. The structure of the AgCdO 11.7 contact material prepared from milled powder was more uniform and showed fewer CdO concentrations. For hard soldering, as the bonding technique, high soldering reliability was achieved through the use of a two-layer contact. A layer of a metal with good wetting properties for liquid silver solder was applied on the contact layer. The second layer may consist, for instance, of sterling silver. It was applied to the contact layer in the pressing operation by pressing together the filled-in contact powder and the silver powder.

By using internally-oxidized milled powder of AgCdO 11.7 as the contact and electrolytic silver powder with a particle size of less than 0.06 mm as the second layer, greater strength in the boundary layer was obtained than with using unmilled internally oxidized AgCdO powder. For demonstrating this, three-layer specimens were prepared for tensile tests, which consisted of a central contact layer of AgCdO 11.7 and a silver layer each on both sides. The three-layer body was soldered with silver solder between two copper studs and stressed in a tensile-testing machine with increasing tensile stress up to fracture. In the specimens of unmilled AgCdO powder the fracture occurred predominantly in the boundary layer between the AgCdO and the silver, and in the specimens of milled AgCdO powder, the fracture was situated partly in the silver and partly in the contact layer, but not in the boundary layer.

EXAMPLE 2

Ag—SnO₂ Contact

As in Example 1, an alloy powder was prepared by pressure-atomizing from the AgSn alloy with 6.8 percent by weight, and the remainder, silver. The particle-size classification under 0.315 was completely internally oxidized in air at 600°C for 4 hours. The composite AgSnO₂ powder with 8.63 percent SnO₂ obtained was comminuted in the blower pulverizer to a particle size of less than 0.2 mm. After admixing 0.2 percent by weight of zinc stearate, the powder was pressed to form cylindrical studs at 8 tons/cm². The sintering was carried out in air at 850°C for 1 hour. The strength of the material in the sintered condition is 80 percent greater for the milled powder than for the unmilled powder. The sintered stud, heated to 800°C, was extruded and the extrusion was cut into contacts. The structure of the extruded material of milled powder was more uniform than the structure of the unmilled powder. The burn-off rate of the contacts of milled powder was almost 50 percent lower than that of unmilled powder and thus yielded a useful life which was longer by nearly a factor 2.

EXAMPLE 3

AgZnO Contact

As in Example 2, an alloy powder of an AgZn alloy with 7.9 percent by weight Zn was prepared by pressure-atomizing. The particle-size fraction under 0.315 mm was completely internally oxidized in air at 600°C for 4 hours. The composite AgZnO powder with 9.82 percent by weight ZnO was comminuted in the blower pulverizer to a particle size of less than 0.2 mm. After admixing and rubbing on 0.2 percent by weight of zinc stearate, the powder was compressed to form cylindrical studs at 8 tons/cm². The sintering was carried out in air at 850°C for 1 hour. The sintered stud, heated to 800°C, was extruded and the extruded shape was cut into contacts. The structure of the extruded material of milled powder was more uniform than the structure of unmilled powder. The burn-off rate of the contacts of milled powder was about 40 percent lower than that of unmilled powder.

EXAMPLE 4

AgCdOSnO₂ Contact

As in Example 2, an alloy powder of an AgCdSn alloy with 7.2 percent by weight Cd and 2.8 percent by weight Sn, with the remainder Ag, was prepared by pressure-atomizing. The particle-size under 0.315 mm was internally oxidized completely in air at 600°C for four hours. The composite AgCdOSnO₂ powder with 8.22 percent by weight CdO and 3.56 percent by weight SnO₂ was comminuted in the blower pulverizer to a particle size of less than 0.2 mm. After admixing and uniformly rubbing on 0.2 percent by weight of zinc stearate, the powder was compressed to form a stud at 8 tons/cm². The sintering took place in air at 850°C for 1 hour. The strength of the sintered material was 28 percent higher for the milled powder than for the unmilled powder. The sintered stud, heated to 800°C, wss extruded and the extrusion cut into contacts. The structure of the extruded material of milled powder was more uniform than the structure of the unmilled powder. The burn-off rate of the contacts was about 30 percent lower than that of unmilled powder, so that an increase of the useful life by 30 percent was obtained.

EXAMPLE 5

AgCdOZnO Contact

As in Example 2, an alloy powder of an alloy of AgCdZn with 7.4 percent by weight Cd and 2.7 percent by weight Zn, with the remainder silver, was prepared by pressure-atomizing. The particle-size range under 0.315 mm was internally oxidized completely in air at 600°C for 4 hours. The composite AgCdOZnO powder with 8.45 percent by weight CdO and 3.36 percent by weight ZnO obtained was comminuted in the blower and pulverized to a particle size of less than 0.2 mm. After admixing and rubbing on 0.2 percent by weight of zinc stearate, the powder was compressed to form a stud at 8 tons/cm². The sintering took place in air at 850°C for 1 hour. The sintered stud, heated to 800°C, was extruded and the extrusion was cut into contacts. The structure of the material of milled powder was more uniform than the structure of unmilled powder. The increase of the useful life due to the lower burn-off rate was 30 percent for contacts of milled powder, as in Example 4, than in contacts of unmilled powder.

EXAMPLE 6

$AgPbOFe_3O_4$

As in Example 2, an alloy powder was prepared by pressure-atomizing from an AgPbFe alloy with 6.1 percent by weight Pb, 0.03 percent by weight Fe, and the remainder Ag. The particle-size fraction under 0.315 mm was internally oxidized completely in air at 600°C for 4 hours. The composite $AgPbOFe_3O_4$ powder obtained with 6.57 percent by weight PbO and 0.04 percent by weight $Fe_3O_4$, with the remainder silver, was comminuted in the blower pulverizer to a particle size of 0.2 mm. After admixing and uniformly rubbing on 0.2 percent by weight of zinc stearate, to powder was compressed to form contacts at 4 tons/cm². The sintering took place in nitrogen at 650°C for 1 hour. The sintered contacts were repressed cold at 8 tons/cm². The structure of the contact material of milled powder was more uniform than the structure of the unmilled powder. The burn-off rate of the contacts of milled powder was about 25 percent lower than that made of the unmilled powder.

What is claimed is:

1. A method for making sintered silver-metal oxide electric contact material, comprising atomizing a molten alloy of silver and non-noble metal into particles of which a fraction is of smaller particle size and another fraction is of larger particle size as the fractions are compared with each other, separating the fraction of particles of larger particle size from the fraction of particles of smaller particle size, internally oxidizing the particles of the separated fraction of larger particle size to form internally oxidized particles, breaking the internally oxidized particles into fragments having a relatively smaller particle size, and compressing the fragments together and sintering them to produce said material.

2. The method of claim 1 in which said separated fraction of particles of larger particle size has a particle size of from about 0.2 to about 1 mm.

3. The method of claim 2 in which said smaller particle size of the fragments is not greater than 0.3 mm.

* * * * *